United States Patent
Tsuji et al.

(10) Patent No.: US 7,324,187 B2
(45) Date of Patent: Jan. 29, 2008

(54) ILLUMINATION SYSTEM AND EXPOSURE APPARATUS

(75) Inventors: Toshihiko Tsuji, Tochigi (JP); Akira Yabuki, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 205 days.

(21) Appl. No.: 10/956,614

(22) Filed: Oct. 1, 2004

(65) Prior Publication Data

US 2005/0110972 A1 May 26, 2005

(30) Foreign Application Priority Data

Oct. 1, 2003 (JP) .............................. 2003-342960

(51) Int. Cl.
*G03B 27/74* (2006.01)
*G03B 27/42* (2006.01)
*G03B 27/54* (2006.01)

(52) U.S. Cl. .............................. 355/68; 355/53; 355/67

(58) Field of Classification Search ................... 355/35, 355/53, 67, 69, 71, 68
See application file for complete search history.

(56) References Cited

U.S. PATENT DOCUMENTS

| | | | | |
|---|---|---|---|---|
| 5,699,148 | A * | 12/1997 | Shiozawa | ...................... 355/71 |
| 5,892,573 | A * | 4/1999 | Takahashi et al. | ............. 355/61 |
| 6,473,160 | B2 * | 10/2002 | Suzuki et al. | ................... 355/53 |
| 6,573,977 | B1 | 6/2003 | Mori | |
| 6,757,050 | B1 * | 6/2004 | Shiozawa | ..................... 355/67 |
| 2001/0028448 | A1 | 10/2001 | Mori | |
| 2001/0033433 | A1 * | 10/2001 | Shinoda | ....................... 359/798 |
| 2002/0089654 | A1 * | 7/2002 | Ota et al. | ....................... 355/67 |
| 2002/0101574 | A1 * | 8/2002 | Tsuji | ............................ 355/69 |
| 2002/0196629 | A1 * | 12/2002 | Terashi | ....................... 362/331 |
| 2003/0002021 | A1 * | 1/2003 | Sato | ............................ 355/67 |
| 2003/0031017 | A1 | 2/2003 | Tsujii | |
| 2003/0076607 | A1 * | 4/2003 | Antoni et al. | ................ 359/858 |
| 2004/0239283 | A1 * | 12/2004 | Galburt et al. | .............. 318/625 |

FOREIGN PATENT DOCUMENTS

| | | |
|---|---|---|
| JP | 58-45533 | 3/1983 |
| JP | 6-69015 | 3/1994 |
| JP | 8-335548 | 12/1996 |
| JP | 2000-277413 | 10/2000 |
| JP | 2001-237169 | 8/2001 |
| JP | 2001-284236 | 10/2001 |
| JP | 2003-45774 | 2/2003 |
| JP | 2003-45784 | 2/2003 |

OTHER PUBLICATIONS

English translation of the Japanese Utility-Model Laid-Open Appl. No. 58-45533 (4 pages).

* cited by examiner

*Primary Examiner*—Alan Mathews
(74) *Attorney, Agent, or Firm*—Morgan & Finnegan, LLP

(57) ABSTRACT

Disclosed is an illumination optical system and an exposure apparatus having the same, and specifically, as an aspect of the invention, an illumination optical system for illuminating a surface to be illuminated, that includes an aperture stop for defining an effective light source distribution upon a predetermined plane which is substantially in a Fourier transform relation with the surface to be illuminated, and a detector disposed adjacent an opening of the aperture stop.

6 Claims, 13 Drawing Sheets

ILLUMINATION SYSTEM AND EXPOSURE APPARATUS

FIELD OF THE INVENTION AND RELATED ART

This invention relates generally to an illumination optical system and an exposure apparatus having the same. More particularly, the invention concerns an illumination system which uses a light emission source of extreme ultraviolet (EUV) region of a wavelength 200 nm to 10 nm or X-ray region, as a light source, and an exposure apparatus that uses the same to expose a workpiece such as a monocrystal substrate for semiconductor wafer or a glass substrate for liquid crystal display device, for example.

For monitoring the exposure apparatus, conventional exposure apparatuses are equipped with a half mirror disposed in a portion of the light path of an illumination optical system, and a few percent of the exposure light is reflected by this half mirror and it is directed to a detection optical system for detecting the reflection light, whereby the light quantity is measured, see Japanese Patent Application Publication No. 06-069015, Japanese Laid-Open Patent Application, Publication No. 08-335548, Japanese Laid-Open Patent Application, Publication No. 2000-277413 (corresponding U.S. Pat. No. 6,573,977), Japanese Laid-Open Patent Application, Publication No. 2001-237169 (corresponding Published U.S. Patent Application, Publication No. 2001/028448), Japanese Laid-Open Patent Application, Publication No. 2001-284236, Japanese Laid-Open Patent Application, Publication No. 2003-045774 (corresponding Published U.S. Patent Application, Publication No. 2003/031017), Japanese Laid-Open Patent Application, Publication No. 2003-045784 (corresponding Published U.S. Patent Application, Publication No. 2003/031017), for example.

However, in an illumination optical system of an exposure apparatus that uses EUV light of a wavelength 13.5 nm as exposure light, for example, since the wavelength is too short, a transmission type (refractive) optical system can not be used, and a reflection optical system multilayered film is used in place thereof. A half mirror is therefore difficult to use there.

Although it is possible to produce a reflective multilayered film upon a substrate and thereafter to remove the substrate to provide a self-supported reflective multilayered film as a half mirror, large area is difficult to achieve and durability thereof is insufficient. It is therefore impractical.

It has been desired to make it easy to detect the quantity of illumination light, in an illumination optical system using light of a wavelength of not greater than 200 nm, particularly, EUV light or X-rays, as illumination light.

SUMMARY OF THE INVENTION

It is accordingly an object of the present invention to provide an illumination optical system and/or an exposure apparatus using the same by which at least one of the inconveniences described above can be solved.

In accordance with an aspect of the present invention, to achieve the above object, there is provided an illumination optical system for illuminating a surface to be illuminated, comprising: an aperture stop for defining an effective light source distribution upon a predetermined plane which is substantially in a Fourier transform relation with the surface to be illuminated; and a detector disposed adjacent an opening of said aperture stop.

In accordance with another aspect of the present invention, there is provided an illumination optical system for illuminating a surface to be illuminated, comprising: a field stop for regulating an illumination region upon the surface to be illuminated; and an imaging system for directing light from said field stop to the surface to be illuminated, wherein said imaging system includes an aperture stop disposed adjacent a pupil plane thereof, and a detector disposed adjacent an opening of said aperture stop.

In accordance with a further aspect of the present invention, there is provided an illumination optical system for illuminating a surface to be illuminated, with light from a light source, comprising: a field stop for regulating an illumination region upon the surface to be illuminated; and a detector disposed adjacent an opening of said field stop, wherein light from the light source has a wavelength in a range of 20 nm to 5 nm.

In accordance with a yet further aspect of the present invention, there is provided an illumination optical system for illuminating a surface to be illuminated, with light from a light source, comprising: a field stop for regulating an illumination region upon the surface to be illuminated; a detector disposed adjacent an opening of said field stop, and an imaging system for directing light from said field stop to the surface to be illuminated, wherein said imaging system includes a multilayered film mirror.

In accordance with a still further aspect of the present invention, there is provided an illumination optical system for illuminating a surface to be illuminated, with light from a light source, comprising: a field stop for regulating an illumination region upon the surface to be illuminated; and a detector disposed adjacent an opening of said field stop, wherein the illumination region defined on the surface to be illuminated has an arcuate shape, and wherein said detector detects a light quantity in regions substantially corresponding to opposite end portions of the arcuate shape.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Figure 1:
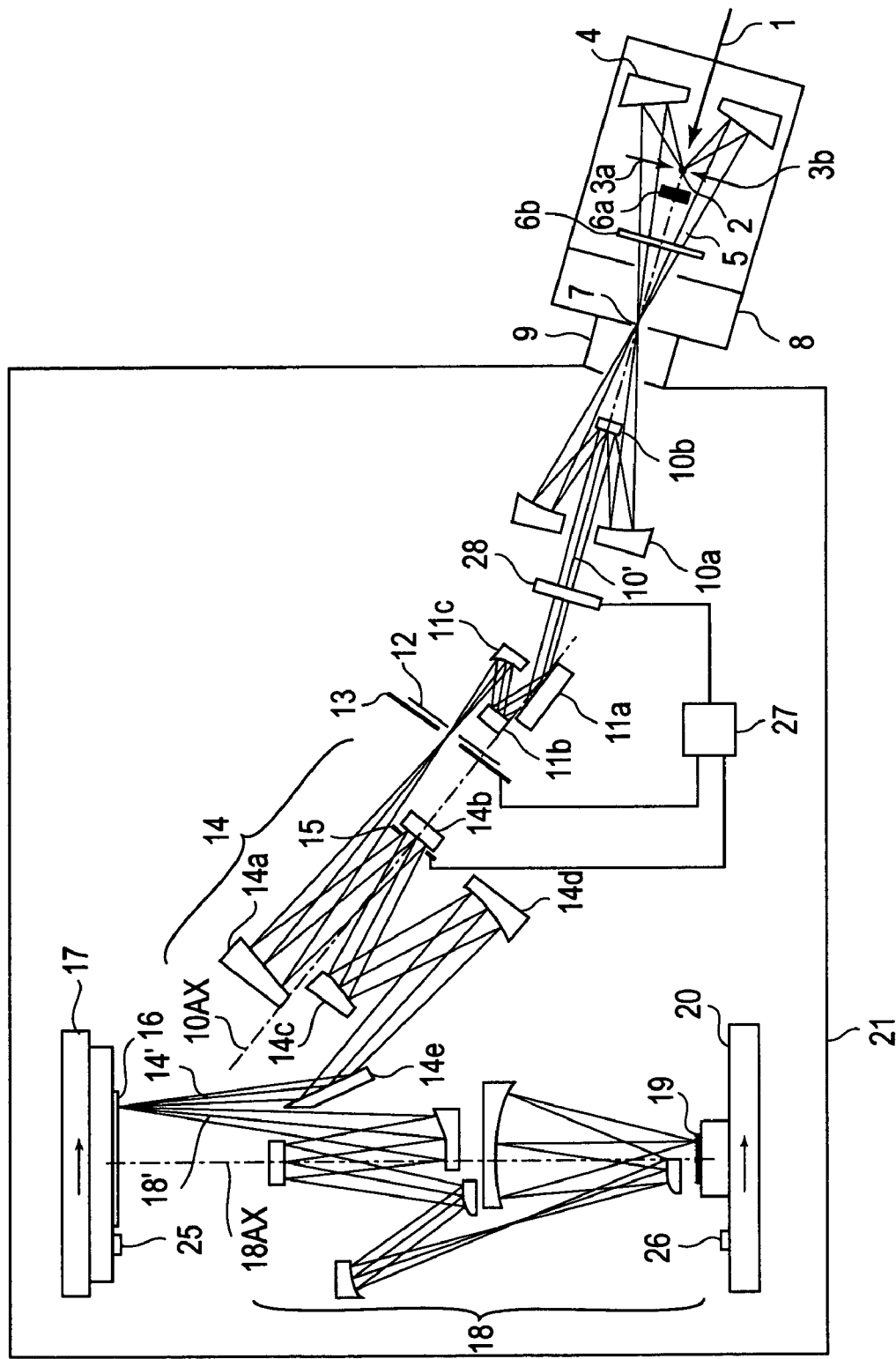
FIG. 1 is a schematic view of an exposure apparatus according to a first embodiment of the present invention.

FIG. 1 is a schematic view of an exposure apparatus according to a first embodiment of the present invention. Denoted in FIG. 1 at 1 is exciting laser light, and denoted at 2 is a plasma light-emission point from which EUV (extreme ultraviolet) light is emitted. Denoted 3a is a nozzle for discharging liquid drops to provide a target for plasma generation, and denoted at 3b is a liquid drop collecting portion for collecting liquid drops not irradiated with exited laser light, for reuse. Denoted at 4 is a light collecting mirror for receiving the light beam emitted from the plasma light-emission point. Denoted at 6a is a filter for removing any scattered particles (debris) from the plasma, and denoted at 6b is a wavelength filter for removing light of a wavelength other than the EUV light. Denoted at 7 is a pinhole-like aperture disposed adjacent a light convergence point of the collecting mirror 4, and denoted at 8 is a vacuum chamber for accommodating the plasma light source therein. These components constitute a light source unit. Here, denoted at 5 is an EUV light beam collected by the mirror 4, and denoted at 9 is a connection for connecting the exposure apparatus main assembly to the plasma light source unit while keeping the vacuum state.

Denoted at 10a and 10b is a parallel transformation optical system that comprise concave and convex mirrors, for transforming the EUV light beam passed through the aperture 7 into approximately parallel light. Denoted at 11a is an integrator having a plurality of cylindrical surfaces, and denoted at 11b and 11c is an optical system including a revolutional paraboloid mirror, for collecting the light from the integrator 11a into an arcuate shape. The elements 11a, 11b and 11c in combination constitute an arcuate transformation optical system. Denoted at 12 and 13 is a slit system (field stop). Specifically, denoted at 12 is a slit having an arcuate opening, and denoted at 13 is a masking blade disposed on a plane optically conjugate with a reflection type mask 16, for restricting the illumination light within the limit of a desired exposure region. Denoted at 14 is a masking imaging system which serves to form an image, taking the masking blade 13 as an image side and taking the reflective mask 16 surface as an image side, by which an arcuate illumination region is defined on the reflection mask. Denoted at 14a, 14b, 14c and 14d are curved surface mirrors which constitute an imaging optical system as the masking imaging system 14. Denoted at 14e is a plane mirror for reflecting light from the imaging system 14a-14d, that is, for deflecting the image side light beam 14' of the masking imaging system 14 upwardly toward the reflection mask 16 so that the light is incident thereon at a predetermined angle. Denoted at 15 is an aperture stop disposed on a pupil plane of the imaging system 14a-14d. The components described above constitute an illumination optical system that illuminates the reflection type mask 16 with light from the light source unit.

Denoted at 17 is a mask stage for holding the mask 16, and denoted at 18 is a projection optical system having a plurality of mirrors. The projection optical system 18 is a co-axial optical system and it is designed to be non-telecentric on the object side and telecentric on the image side. Denoted at 19 is a wafer having a photosensitive material applied thereto, and denoted at 20 is a wafer stage for holding the wafer 19. Denoted at 25 is an illuminometer for measuring the illuminance on a plate equivalent to the reflection type mask 16 surface, and denoted at 26 is an illuminometer for measuring the illuminance upon a plane equivalent to the wafer 19 surface. Denoted at 27 is an integrated exposure amount controller for controlling the integrated exposure amount upon the wafer 19 surface, and denoted at 28 is a shutter and its open/closure period is controlled on the basis of a signal from the integrated exposure amount controller 27. Denoted at 21 is a vacuum container for keeping the whole optical system in a vacuum ambience to prevent attenuation of EUV light.

High-power exciting pulse laser light 1 emitted from an exciting laser unit which comprises an exciting laser light source and a collecting optical system (not shown) is converged at the position of the light emission point 2, and thus a laser plasma light source portion is defined. The liquid drops (e.g., Xe) which serve as a target of the laser light source are discharged successively from the nozzle 3a at regular time intervals, and they pass through the light convergence point 2. As a liquid drop discharged thereby just reaches the position 2, the exciting laser pulse light 1 irradiates this liquid drop, by which a high-temperature plasma emission point 2 is generated and, due to heat radiation from this plasma, EUV light is produced.

In this embodiment, liquid drops of Xe are used as the target material. However, as such target material, Xe gas may be discharged into a vacuum and a cluster produced by adiabatic expansion may be used. Alternatively, Xe gas may be cooled and solidified by a metal surface, or as a further alternative, a metal tape such as Cu may be used. Further, an undulator may be used as the EUV light source. Moreover, as the EUV light source, a plasma light source of "discharge type" such as Z pinch type, plasma focus type, or capillary discharge type, for example, may be used.

The EUV light emitted from the plasma light-emission point 2 is collected by the collecting mirror 4 which may be a spheroidal mirror, for example, and it is extracted as EUV light. Then, by means of the filter 6a, any scattered particles (debris) directly scattering forwardly from the plasma and its periphery are removed. Furthermore, as required, unwanted wavelength components unnecessary for EUV exposure are removed by use of the filter 6b. Thereafter, the EUV light is converged at the position of the pinhole-like aperture 7 which is provided at the interface between the vacuum container 8 accommodating the plasma light source therein and the vacuum chamber 21 of the exposure apparatus major assembly. The vacuum container 8 of the light source unit and the vacuum chamber 21 of the exposure apparatus are connected to each other by means of the connection 9.

The EUV light passed through the aperture 7 is transformed into approximately parallel light 10' by means of the parallel transformation optical system that comprises a concave surface mirror 10a having an opening at its center, and a convex mirror 10b having a diameter smaller than the mirror 10a. Here, the concave mirror 10a has an opening through which the light reflected by the convex mirror 10b passes. This opening is disposed adjacent the optical axis of the EUV light from the light source. These mirrors 10a and 10b have a reflection surface which is approximately rotationally symmetrical with respect to the optical axis of the EUV light from the light source, and the central axes of these mirrors are approximately coincident with the optical axis of the EUV light.

The collecting mirror 4 and the mirrors 10a and 1b have a reflecting multilayered film formed thereon, for efficient reflection of EUV light. Since a portion of radiation energy from the high-temperature plasma 2 is absorbed thereby, the temperature thereof becomes high during the exposure. In consideration of it, as regards its material, a material having good heat conductivity such as metal may be used and, additionally, cooling means (not shown) may be provided to cool the mirror continuously during the exposure process.

Although it will not be described below specifically, the reflection surface of each mirror used in the optical system has a reflecting multilayered film formed thereon, for efficient reflection of EUV light. Also, as required, each mirror may be made of a material having good heat conductivity such as metal, for example, and cooling means may be provided therefor.

The EUV light 10' having been transformed into approximately parallel light, then passes the shutter 28 for exposure amount control, and is incident on the integrator 11a having a plurality of reflection type cylindrical surface mirrors. The opening/closing of the shutter 28 is controlled by means of the integrated exposure amount controller 27. This operation will be described later.

The EUV light incident on the integrator 10a is divided and diverged by the cylindrical surfaces, and these divided and diverged light beams are then collected into an arcuate shape by means of the plane mirror 11b and the revolutional paraboloid mirror 11c, by which an arcuate illumination region having uniform illuminance distribution is produced at the opening of the arcuate slit 12.

Here, the principle of uniformly illuminating an arcuate region by means of the integrator 11a will be explained in greater detail, with reference to other drawings.

Figure 3A:
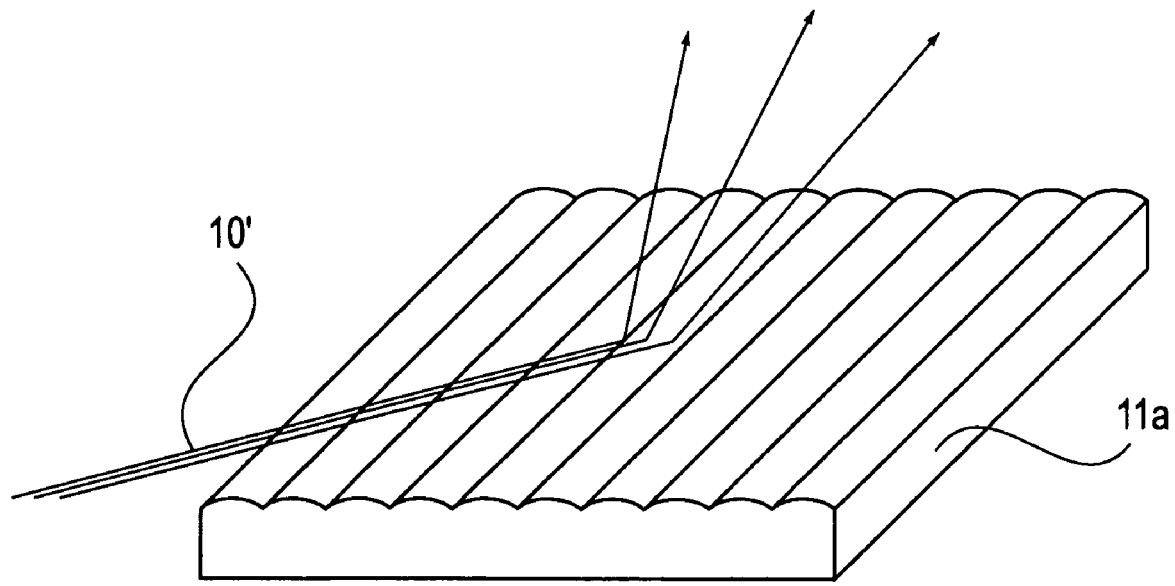
FIGS. 3A and 3B are schematic views, respectively, each illustrating an example of integrator.
Figure 3B:
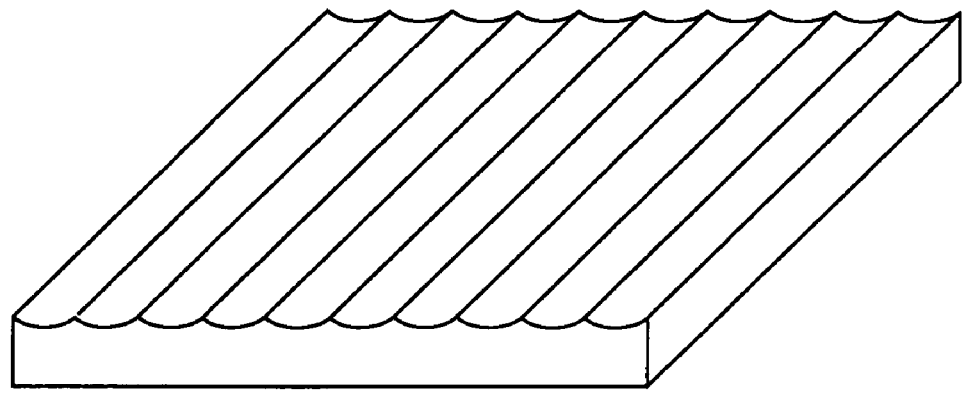

FIG. 3A is a schematic and perspective view showing a case wherein parallel light is incident on a reflection type integrator 11a which has a plurality of convex cylindrical (outer cylindrical) surfaces. The approximately parallel EUV light 10' described above is incident on the integrator in a direction as shown in the drawing. FIG. 3B is a schematic and perspective view of a reflection type integrator having a plurality of concave cylindrical (inner cylindrical) surfaces, and having a similar function as of the integrator of FIG. 3A. Although the integrator 11a of FIG. 1 embodiment is a reflection type convex-cylindrical-surface integrator such as shown in FIG. 3A, it may be a reflection type concave-cylindrical-surface integrator such as shown in FIG. 3B, and alternatively, it may be a combination of these types of integrators.

Figure 4:
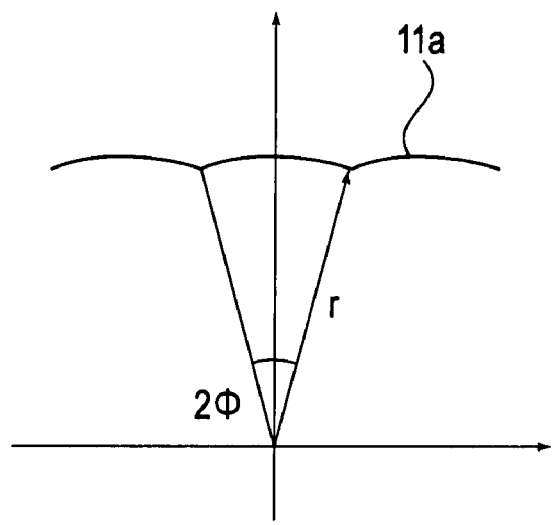
FIG. 4 is a schematic and sectional view, illustrating the sectional shape of an integrator.
Figure 5:
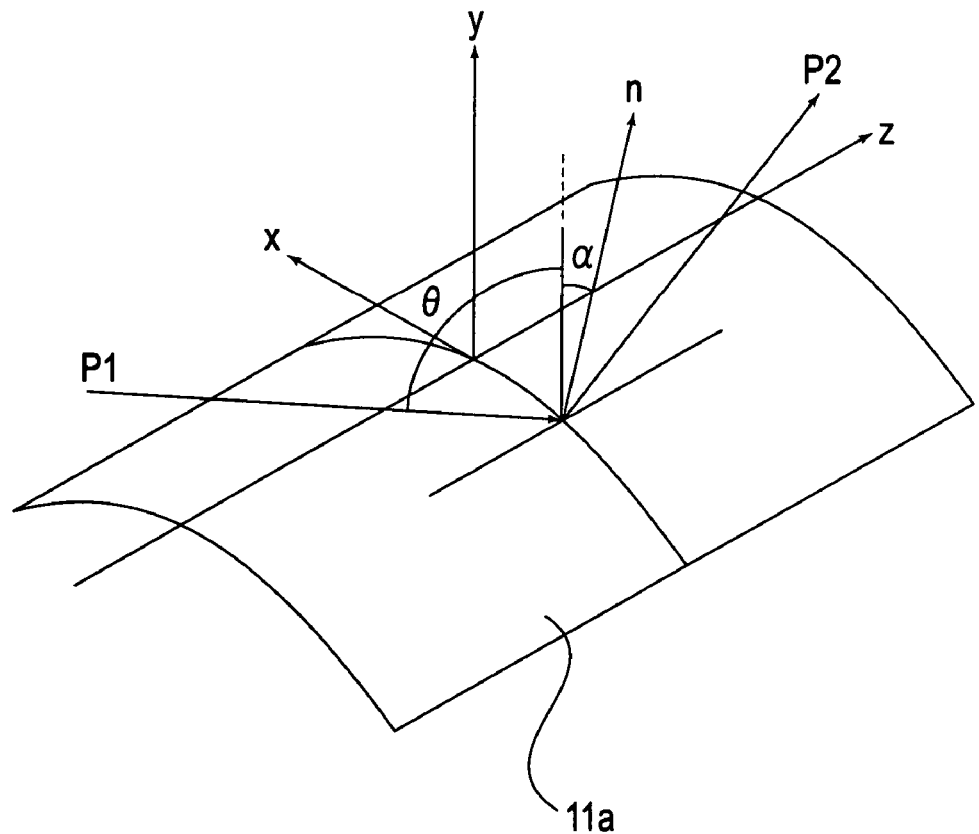
FIG. 5 is a schematic view for explaining an angular distribution of light reflected by a cylindrical surface.
Figure 6:
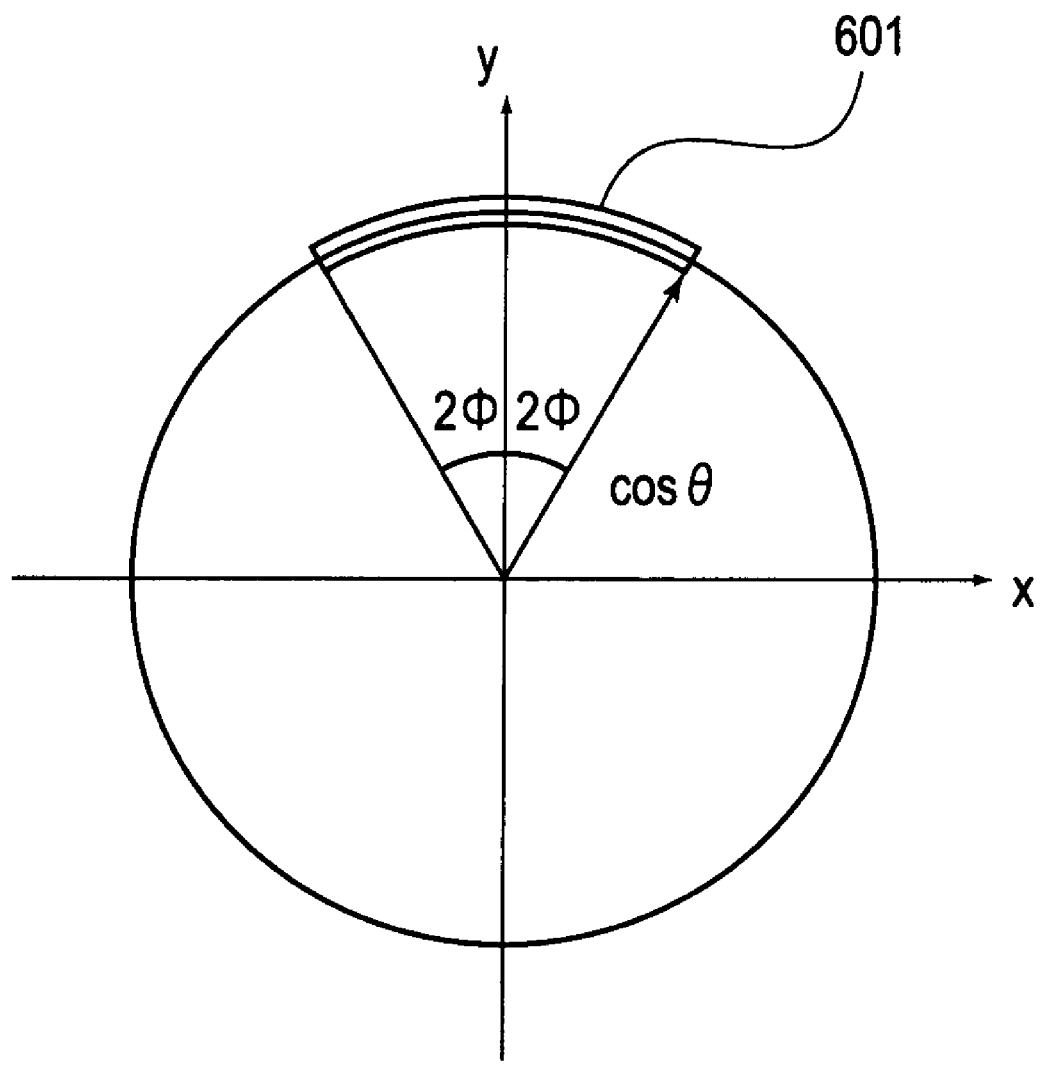
FIG. 6 is a schematic view for explaining how an arcuate region is defied by light reflected by a cylindrical surface.

FIG. 4 is a schematic and sectional view of a reflection type convex-cylindrical-surface integrator, and FIG. 5 is a schematic view for explaining reflection of EUV light at a cylindrical surface of a reflection type convex-cylindrical-surface integrator. FIG. 6 is a schematic view for explaining angular distribution of EUV light reflected by a cylindrical surface of a reflection type convex-cylindrical-surface integrator. In these drawings, the reference numeral 11a denotes the reflection type convex-cylindrical-surface integrator.

When as shown in FIG. 3A an approximately parallel EUV light 11 is incident on the integrator 11a having a plurality of cylindrical surfaces, secondary light sources of linear shape are produced adjacent the respective cylindrical surfaces and, additionally, the angular distribution of EUV light projected from these secondary light sources takes a conical surface shape. By using a reflection mirror having its focal point placed at the secondary light source position, the EUV light is reflected to illuminate the reflection type mask or a plane conjugate with the reflection type mask, illumination in an arcuate shape is enabled.

For explanation of the operation of a reflection type optical integrator having a plurality of cylindrical surfaces, referring to FIG. 5, the action of reflection light where parallel light is incident of a single cylindrical reflection mirror will first be described.

Now, a case wherein parallel light is incident on a single cylindrical surface at an angle $\theta$ with respect to a plane perpendicular to the central axis of the cylindrical surface, will be considered. If the light-ray vector of the parallel incident light is expressed by:

$$P1 = (0, -\cos\theta, \sin\theta)$$

and the vector of the normal line of the reflection surface of the cylindrical surface shape is expressed by:

$$n = (-\sin a, \cos a, 0),$$

then the light-ray vector of the reflected light is expressed by:

$$P2 = (-\cos\theta \times \sin 2a, \cos\theta \times \cos 2a, \sin\theta).$$

Here, by plotting the light-ray vector of the reflection light in the phase space, as shown in FIG. 6, a circle having a radius $\cos\theta$ on x-y plane is obtained. Namely, the reflection light takes the form of divergent light having conical surface shape, and a secondary light source is present adjacent the apex of the cone. This secondary light source is present as a real image outside the reflection surface where cylindrical surface of the integrator 11a is concave, and is present as a virtual image inside the reflection surface where the cylindrical surface is convex. Also, as shown in FIG. 4, if the reflection surface is limitedly a portion of a cylindrical surface and its central angle is equal to $2\phi$, as shown in FIG. 6 the range of presence of the light-ray vector P2 of the reflection light takes an arcuate form 601 having a central angle $4\phi$ on the x-y plane.

Next, a case wherein a revolutional paraboloid mirror of a focal length f, having a focal point placed adjacent the secondary light source position which is defined as a result of incidence of parallel light upon a cylindrical-surface reflection mirror described above, is used and wherein the surface to be illuminated is disposed at a distance spaced from the reflection mirror by a distance f, is considered. The light emitted from the secondary light source is divergent light having a conical surface shape, and after being reflected by the reflection mirror of focal length f, it is transformed into parallel light. The reflection light here is s sheet-like beam having an arcuate sectional shape with a radius $f \times \cos\theta$ and a central angle $4\phi$. As a result of this, as shown in FIG. 6, only an arcuate region 601 having a radius $f \times \cos\theta$ and a central angle $4\phi$ can be illuminated thereby.

Although the foregoing description concerns a single cylindrical reflection mirror, referring now to FIG. 2, a case where parallel light 10' having a certain light flux diameter is incident on a wide-area integrator 11a having many cylindrical surfaces disposed in parallel to each other, in a direction as illustrated in FIG. 1, will be explained.

Figure 2:
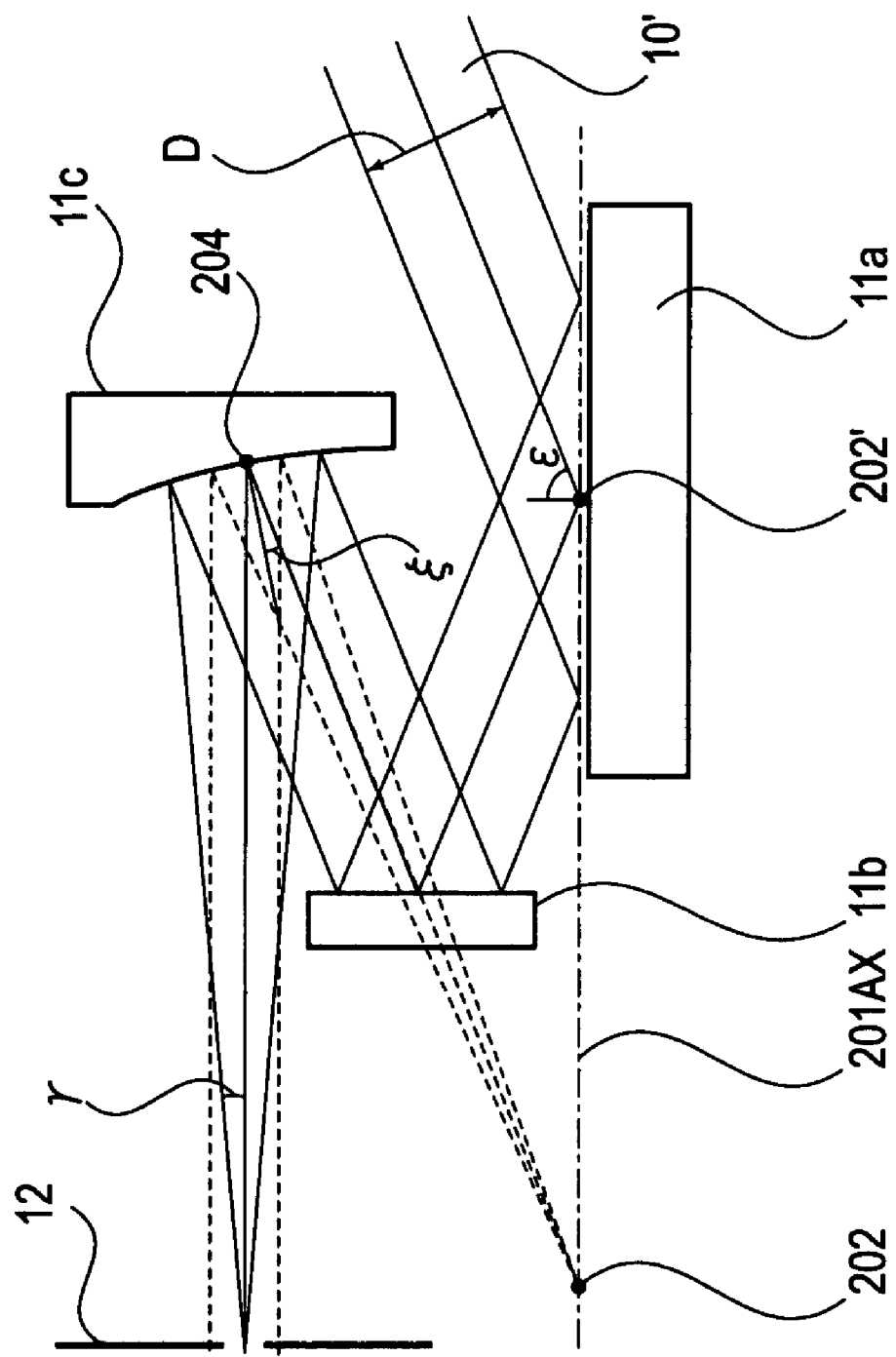
FIG. 2 is a schematic view for explaining a case wherein parallel light is incident upon an integrator.

In FIG. 2, denoted at 11a is an integrator such as described above, and denoted at 11b is a plane mirror. Denoted at 11c is a revolutional paraboloid mirror, and denoted at 12 is a slit having an arcuate opening. The revolutional paraboloid mirror 11c is a mirror with a reflection surface which has a central symmetry axis at an axis 201AX and which is formed as a portion of a plane defined by rotating a parabola having its focal point at a point 202, around the axis 201AX as a rotational axis. The distance between the focal point 202 and the central point 204 of the mirror surface effective region corresponds to the focal length f. Also, the distance between the point 204 and the arcuate slit 12 is set to be approximately equal to the focal length f.

The revolutional paraboloid mirror 11c is disposed so that its rotational axis 201AX extends adjacent (or while being contained in) the reflection surface of the integrator 11a, and in parallel to the reflection surface and along the juxtaposed direction of the cylindrical surfaces. Between the effective region central point 204 and the focal point 202 of the revolutional paraboloid mirror 11c, there is plane mirror 11b disposed as shown in the drawing, such that a point 202' being symmetrical with the focal point 202 with respect to the mirror 11b reflection surface is placed approximately at the central position of the reflection surface effective region of the integrator 11a. Namely, the optical path length from the position 204 to the position 202' is equal to the focal length f.

With this arrangement, the position 202' and the arcuate slit 12 are placed in such relationship that they are spaced by the same focal length f from the revolutional paraboloid mirror 11c, that is, they are placed in Fourier's transform relation. Therefore, if approximately parallel light 10' is incident on the integrator 11a as shown in the drawing, light is converged in the vicinity of the arcuate slit 12.

Here, the incidence angle $\xi$ of the principal ray of the EUV light upon the revolutional paraboloid mirror 11c is set at a small incidence angle (an angle greater than 0 deg. and not greater than 45 deg.) and, more specifically, not greater than 20 deg. With this setting, the amount of blur to be produced when light is collected to the arcuate slit 12 can be reduced as compared with a case where the incidence angle $\xi$ is large, and thus the efficiency of collecting light to near the arcuate opening can be improved. This effectively reduces a loss of light due to eclipse, and increases the illumination system efficiency.

Since the angular distribution of the light reflected by a reflection mirror having many cylindrical surfaces arrayed in parallel to each other is the same as of the preceding example. Thus, if the incidence angle of light upon the integrator 11a is e, the result is that, in the vicinity of the arcuate slit 12, an arcuate region of a radius fxcose is illuminated. Further, since the light impinging on a single point adjacent the arcuate slit 12 comes there from the entire irradiation region of the reflection mirror, constituted by a number of cylindrical surfaces arrayed in parallel, if the light flux diameter of the approximately parallel EUV light 10' is D, the angular expansion thereof (i.e., collecting NA) $\gamma$ is $\gamma=D/f$.

Here, in the arcuate illumination region, light rays from many cylindrical surfaces of the integrator 11a are superposed one upon another with respect to the direction along the arcuate shape. By this, uniformess of illuminance is accomplished. Namely, efficient and uniform arcuate illumination is achieved thereby.

Referring back to FIG. 1, the exposure method of this embodiment will be described more. In FIG. 1, as regards an arcuate illumination region produced in the vicinity of the opening of the arcuate slit 12, while a portion of this region is restricted by the masking blade 13, by means of the masking imaging system 14 it is magnified or reduced at a desired magnification and then projected on the reflection type mask 16, held by the mask stage 17, at a desired incidence angle. By this, an arcuate illumination is defined on the mask 16, and arcuate illumination of the mask 16 is thus carried out. The curvature center of the arcuate illumination region is approximately coincident with the optical axis AX of the projection optical system 18.

The EUV light from the reflection type mask 16, which now bears circuit pattern information, is projected and imaged on a wafer 19 having a photosensitive material applied thereto, through the projection optical system 18, whereby circuit pattern exposure is carried out.

The wafer 19 is fixed to the wafer stage 20, and it can be moved vertically and horizontally as viewed in the drawing. The movement is controlled by means of a laser interferometer (not shown), for example. If the magnification of the projection optical system 18 is M, the reflection mask 16 may be moved in a direction parallel to the sheet of the drawing at a velocity v while, simultaneously, the wafer 19 may be synchronously scanned (scanningly moved) in a direction parallel to the sheet of the drawing, at a velocity v/M. By doing so, the whole surface scan exposure is carried out.

The projection optical system 18 comprises a plurality of multilayered-film reflection mirrors, and it is designed so that a narrow arcuate region off the optical axis center AX has a good imaging performance. It functions to project, in a reduced scale, a pattern of the reflection type mask 16 onto the wafer 19 surface. The projection optical system is a telecentric system on the image side (wafer side). As regards the object side (reflection type mask side), usually it is made non-telecentric in order to avoid physical interference with the illumination light impinging of the reflection type mask 16. In this embodiment, for example, the principal ray at the object side is tilted by about 6 deg. with respect to the direction of a normal to the mask 16.

Next, description will be made on the following points, sequentially:

a) Scan exposure by arcuate illumination;
b) Correction of exposure unevenness by arcuate slit 12;
c) Operation of masking blade 13 in scan exposure;
d) Structure of masking imaging system; and
e) How to monitor of the exposure amount.

Figure 7A:
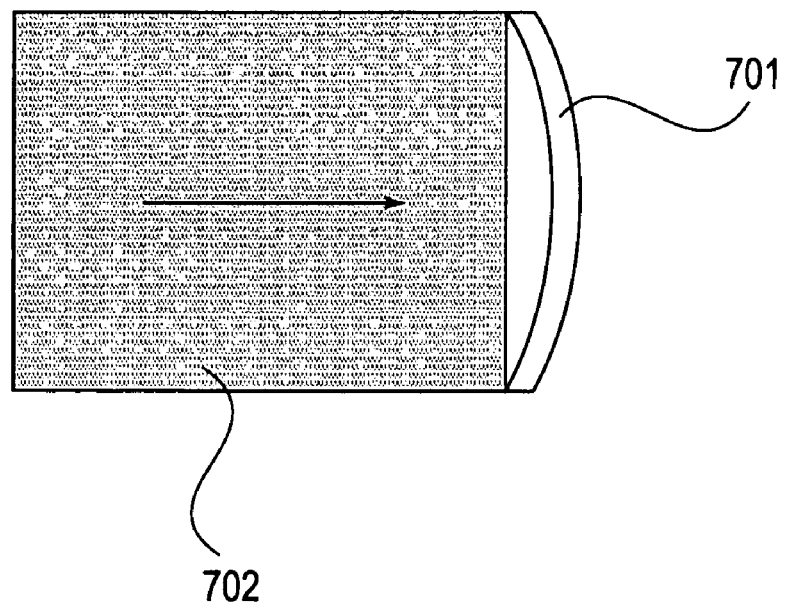
FIGS. 7A and 7B are schematic views, respectively, for explaining a scan exposure operation.
Figure 7B:
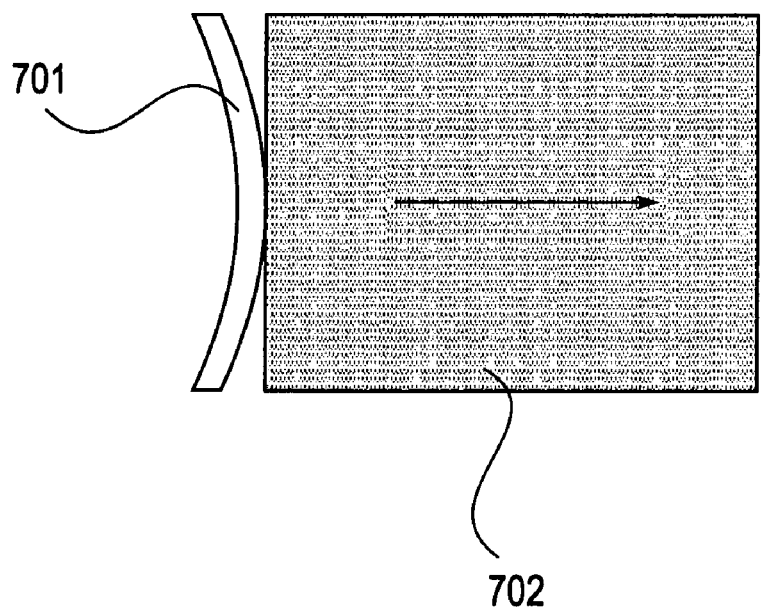

FIGS. 7A and 7B illustrate the states of start and end of the scan exposure upon a wafer surface. In these drawings, denoted at 701 is an arcuate illumination region on the wafer surface, and denoted at 702 is an exposure region which is the subject of exposure. In the case of these drawings, by the wafer stage driving, the exposure region 702 shifts from left to right in the drawings and, as a result, the arcuate illumination region 701 relatively scans the exposure region 702. Upon stat or and end of the exposure, the illumination region 701 may irradiate the wafer surface portion other than the exposure region 702, but in order to prevent this, the masking blade blocks the light, as will be described later in detail with reference to the operation of the masking blade.

The exposure may be carried out by the scan in an opposite direction relative to the scan direction shown in this example, essentially in a similar manner.

Figure 8:
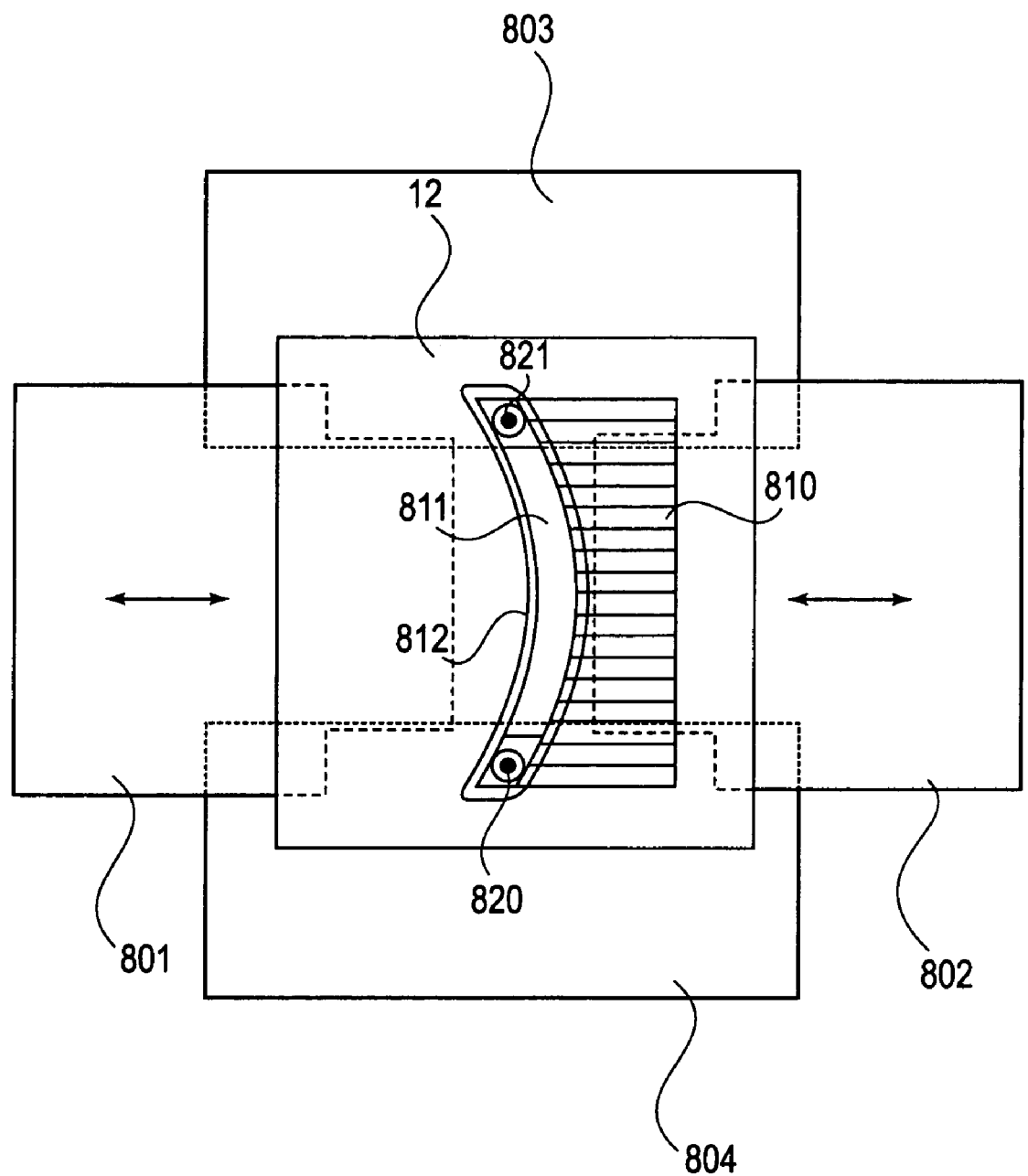
FIG. 8 is a schematic view of a variable-aperture slit and a masking blade.

Referring now to FIG. 8, a method of correcting exposure unevenness by the arcuate slit 12, in the scan exposure such as described above, will be explained. In FIG. 8, denoted at 810 are a large number of movable edge portions juxtaposed with each other to partially change the slit width 811 of the arcuate slit 12. Denoted at 811 is a slit aperture for defining an arcuate illumination region, and denoted at 812 is an arcuate irradiation region produced by the integrator 11a and mirror systems 11b and 11c such as described hereinbefore. Light projected from this region and passing through the slit opening 811 is to be extracted.

In the scan exposure and when a circuit pattern of the reflection type mask 16 is transferred to the wafer 19 in a reduced scale, if there is illuminance unevenness inside the arcuate slit, exposure non-uniformess results from the scan exposure. In order to meet this, the slit width of only such portion where the illuminance is relatively strong within the arcuate slit is slightly narrowed by partially moving the movable edge portion 810 through a driving system (not shown), to reduce the light quantity by a desired amount, and then the scan exposure is carried out. With this procedure, exposure of uniform intensity as being integrated throughout the whole exposure region is accomplished.

The masking blade 13 comprises four light blocking plates 801, 802, 803 and 804. In FIG. 8, the upper and lower light blocking plates 803 and 804 serve to intercept the light at the opposite ends of the arcuate irradiation region 812 in the arcuate slit opening 811, thereby to determine the vertical width (scan width) of the exposure region 702 shown in FIG. 7A. Additionally, in these light-blocked portions, namely, the opposite end portions of the arcuate irradiation region 812 (i.e., those portions corresponding to opposite end portions in the circumferential direction of the arcuate illumination region of the mask), there are sensors 820 and 821 for monitoring the light quantity. Since the sensors 820 and 821 are disposed at the opposite end portions in the circumferential direction of the arcuate illumination region 812, the quantity of light which inherently would be simply blocked can be detected. Therefore, the light quantity monitoring does not cause a loss of light quantity. The manner of controlling the integrated exposure amount on the basis of these sensors will be described later, in relation to a sensor disposed at an aperture stop of the masking imaging system.

In this example, two sensors are provided at opposite ends of an arcuate shape. However, only one may be provided at one and.

The light blocking plates 801 and 802 move in horizontal directions as viewed in the drawing, in the scan exposure and from start to end of exposure of a single shot, to open and close the clearance thereby to determine the horizontal width (scan length) of the exposure region 702. This will be explained in detail with reference to FIG. 9.

Figure 9:
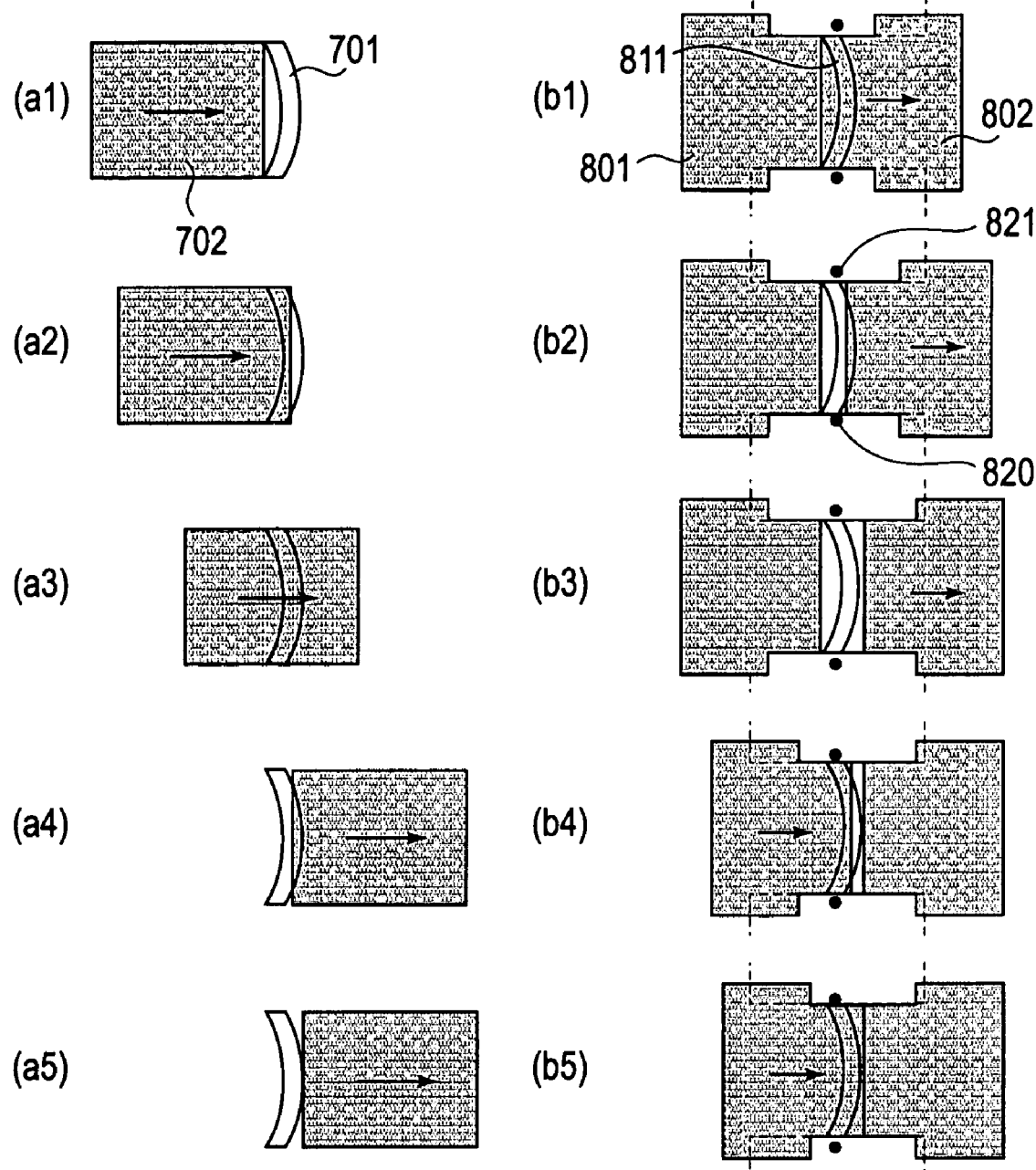
FIG. 9 is a schematic view for explaining masking blade operation during scan exposure.

In FIG. 9, (a1) to (a5) illustrate the states of arcuate illumination region 701 and exposure region 702 in time series from start to end of the scan exposure. On the other hand, (b1)-(b5) illustrate motions of the light blocking plates 801 and 802 of the masking blade 13 corresponding to the states of (a1)-(a5), respectively.

In the state of (a1) where the exposure is just going to be initiated, as shown in (b1) the light blocking plate 802 starts rightward motion and initiates its operation for opening the clearance. At this moment, since the arcuate illumination region 701 is blocked, actually it is not illuminated, although it is depicted in the drawing. As the scan exposure has just started as shown in (a2), the light blocking plate 802 moves such as shown in the state of (b2) just to block, to light, a portion of the arcuate illumination region 701 sticking out of the exposure region 701. Subsequently, the arcuate illumination region 701 is being present inside the exposure region 702 and scan exposure is being carried out, as shown in (a3), the light blocking plate 802 has moved rightwardly as shown in (b3) such that the arcuate slit opening 811 is fully opened.

Subsequently, as the end of scan exposure is nearing as shown in (a4), the light blocking plate 801 moves rightwardly in this case, so that a portion of the arcuate illumination region 701 sticking out of the exposure region 702 is blocked to light. Then, as the scan exposure is completed as shown in (a5), the light blocking plate 801 has moved to completely cover the slit opening 811. With the sequential operations described above, scan exposure is carried out in relation to a desired exposure region.

From the start to the end of exposure described above, a portion of exposure light is incident on the sensors 820 and 821 which are disposed in the light-blocked portions at the opposite ends of the arcuate illumination region, and by using the detected light quantity (an average of two sensor outputs, for example), exposure amount control is performed, to be described later.

Next, details of the masking imaging system 14 will be explained in conjunction with FIG. 10. The masking imaging system 14 is an imaging optical system, taking the masking blade 13 as an image plane while taking the reflection type mask 16 (position 102 in FIG. 10) as an image plane, and it comprises mirrors with reflective multilayered films. This imaging optical system is a co-axial optical system, and it has an imaging function for producing an arcuate illumination region suitable to the projection system 18, at a predetermined magnification with respect to the arcuate region on the object side being defined approximately about the optical axis 10AX.

Figure 10:
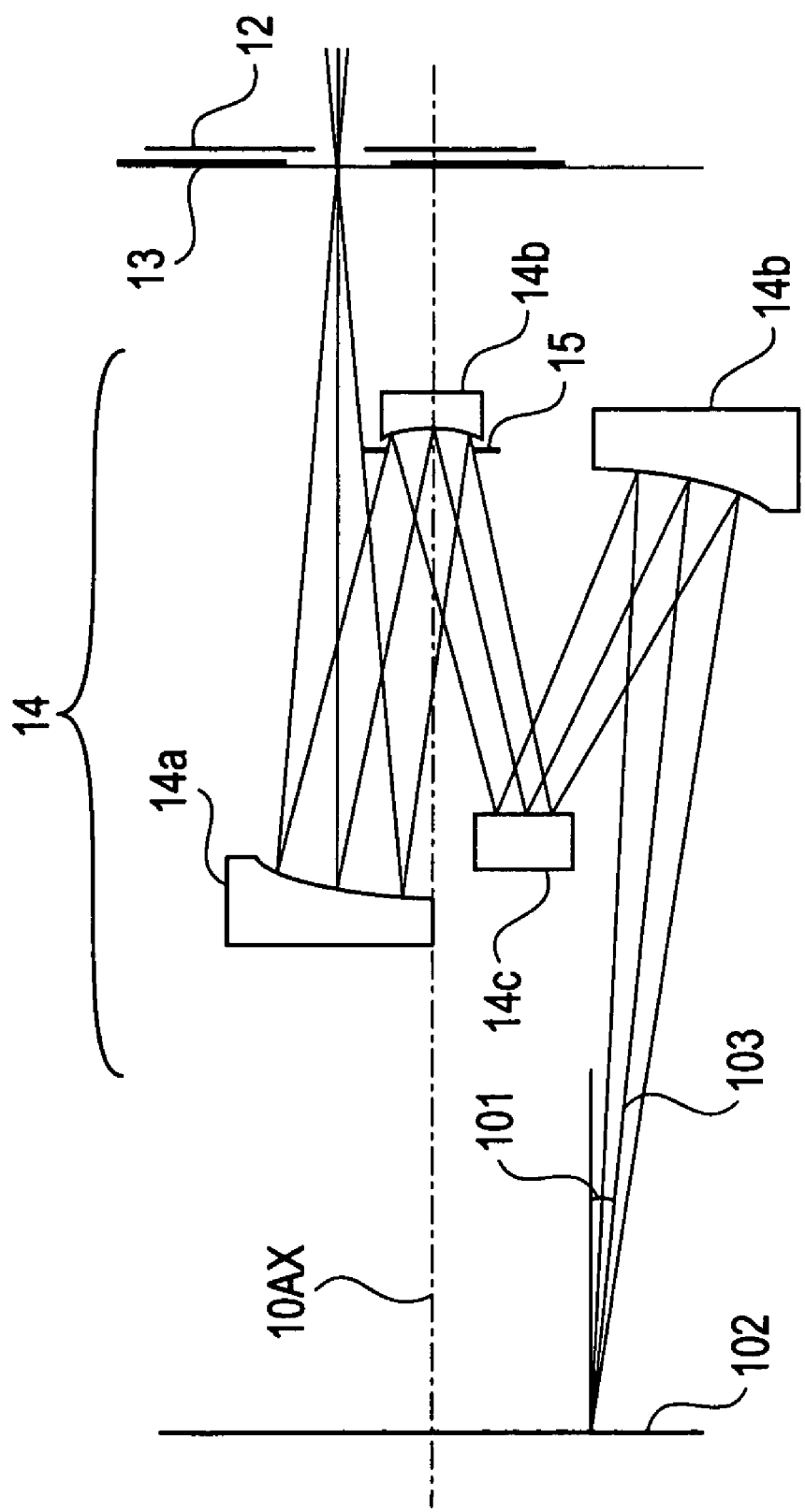
FIG. 10 is a schematic view of a masking imaging system.

In FIG. 10, denoted at 14a, 14b, 14c and 14d are mirrors having spherical or aspherical surfaces having a concave or convex shape. In an order from the mirror 14a, they have concave, concave, convex and concave shapes. In this embodiment, the pupil plane of the masking imaging system 14 is adjacent the reflection surface of the mirror 14b, and an aperture stop 15 is disposed there. By changing the aperture pattern of the aperture stop 15, the convergence angle of illumination light on the reflection mask side (i.e., coherent factor s) can be changed, or deformed illumination can be performed. Details will be described later.

The EUV light converged at the position of the masking blade 13 disposed adjacent the arcuate slit 12 is incident on the masking imaging system 14, with its principal ray being in parallel to the optical axis 10AX, that is, being in telecentric on the object side. The thus incident light is collected toward the image plane 102 by way of the four mirrors and the aperture stop 15. It should be noted here that the structure is non-telecentric on the image side and that the incidence angle 101 of the principal ray 103 upon the image plane 102 (that is, the angle defined between the principal ray 103 and the optical axis 10AX) is approximately equal to the tilt angle of the object-side principal ray of the projection system 18 with respect to a normal to the mask surface. Namely, the angle defined between the optical axis 10AX and the mask-side principal ray of the imaging system 14a-14d, corresponding to each position inside the illumination region of the reflection type mask is made approximately equal to the angle defined between the mask-side principal ray of the projection optical system and the normal to the mask surface. In this embodiment, the incidence angle is set about 6 deg. and it is equal to the angle to be defined between a corresponding principal ray of the projection optical system 18 on the mask side and the normal to the mask surface. As a result, the angle of the mask-side principal ray of the imaging system with respect to the optical axis of the imaging system is approximately equal to the angle defined between the mask-side principal ray of the projection optical system and the normal to the mask surface. As regards the imaging system, it is well corrected also in relation to image-side blur, and it is designed so that the spot diameter on the image plane is kept not greater than 5 mm, preferably, not greater than 1 mm.

In the image-side light 14' of the masking imaging system 14 shown in FIG. 1, when the image side light is upwardly deflected by the plane mirror 14e toward the reflection type mask 16, as a result of reflection by the mirror 14e, the orientation of the arch of the arcuate illumination region defined by the light 14' is reversed and, additionally, the center of the arch is substantially registered with the point of intersection between the central axis 18AX of the projection system 18 and the reflection mask surface. By setting the incidence angle 101 in as described, the principal ray of the light 14' and a corresponding principal ray of the object-side light 18' can be approximately registered with each other, taking the reflection mask as a reflecting surface.

Next, the manner of changing the coherent factor s or performing deformed illumination such as ring-zone illumination, for example, by changing the aperture stop 15 of the masking imaging system 14, will be explained.

Figure 11A:
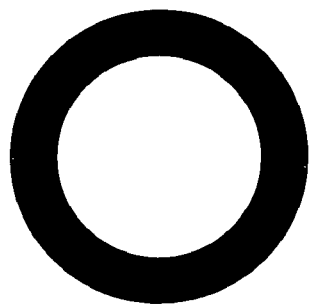
FIGS. 11A, 11B, 11C and 11D are schematic views, respectively, for explaining examples of aperture shape.
Figure 11B:
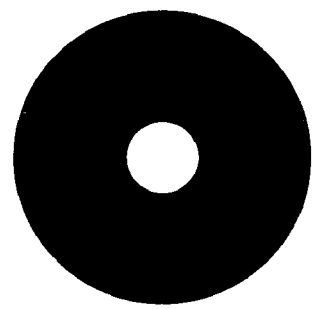
Figure 11C:
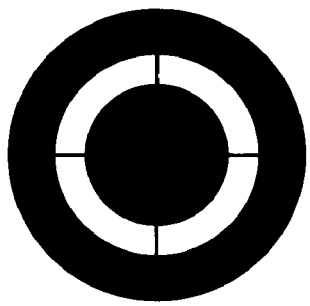
Figure 11D:
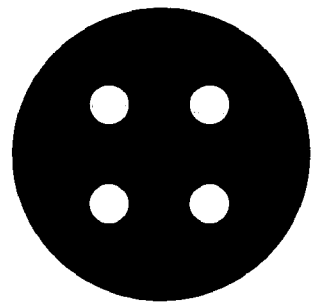

The aperture stop 15 is at pupil plane of the masking imaging system, that is, a plane being in Fourier transform relation with the mask, and thus the aperture stop 15 is in an optically conjugate relation with the pupil plane of the projection system 18. Therefore, the aperture pattern of the aperture stop 15, that is, the pattern of transmitted light corresponds to the light source image (i.e., effective light source distribution) upon the pupil plane of the projection system. FIGS. 11A-11D show examples of shapes to be formed as the aperture of the aperture stop 15. FIG. 11A shows a shape corresponding to large s for standard illumination. FIG. 11B shows a shape corresponding to small s for standard illumination. FIG. 11C shows a shape corresponding to ring-zone illumination. FIG. 11D shows a shape corresponding to quadruple illumination.

Several aperture patterns such as those may be prepared as a turret, for example, by rotating the turret, a desired aperture pattern is chosen. Without using such turret, any other mechanical method may be used. For example, a plurality of aperture stops may be prepared and they may be interchanged sequentially. An iris diaphragm may of course be used. Furthermore, the aperture stop may disposed not upon the plane being substantially in Fourier transform relation with the mask (surface to be illuminated), but upon or adjacent a plane optically conjugate with the Fourier transform relation plane.

Next, the structure in which sensors for measuring the exposure amount are disposed around the aperture of the aperture stop 15 will be explained, taking the standard illumination with large s, that is, the aperture stop of FIG. 11A, as an example.

Figure 12:
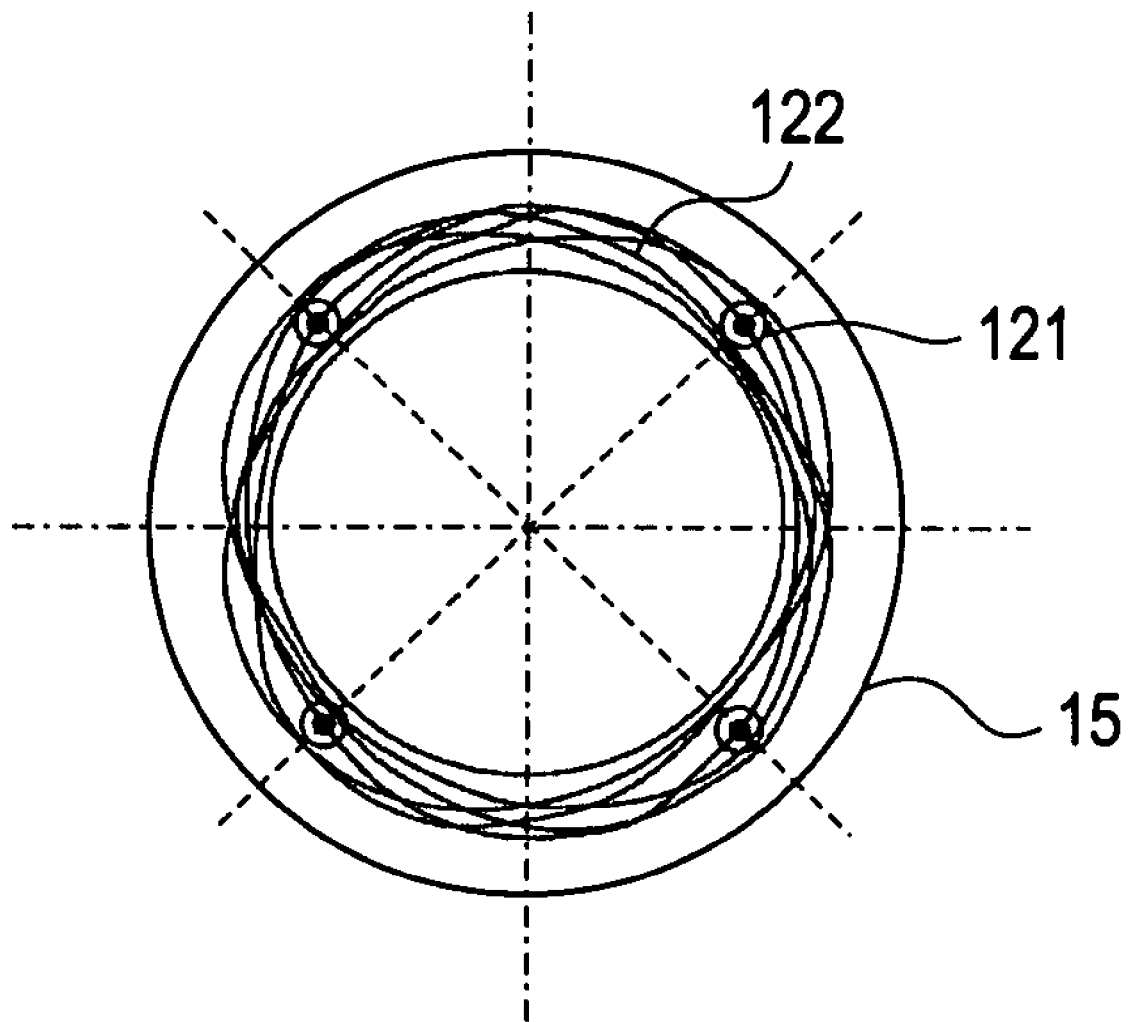
FIG. 12 is a schematic view of an aperture stop and sensors disposed adjacent the opening thereof.

FIG. 12 illustrates the structure in which sensors for monitoring the quantity of exposure light are disposed around the opening of the aperture stop 15. In this drawing, denoted at 121 are sensors, and in this case four sensors are disposed around the opening, equiangularly by 90 deg. This is merely an example, and if necessary more than four sensors may be used. Furthermore, in this embodiment, the aperture stop and the sensors are made integral. However, as a matter of course, sensors may be provided adjacent the front face of the aperture stop, and they may be fixedly supported by a separate member. Moreover, while the example of FIG. 11A is used as the aperture stop, any other aperture stops may be used, with sensors being similarly disposed around the opening.

By disposing sensors upon or adjacent a plane which is substantially in Fourier transform relation with the mask or which is conjugate with the mask surface, the angular distribution of light irradiating the mask can be monitored as well.

Here, reference numeral 122 denotes representative lines that depict regions in which light beams eclipsed by the aperture stop are incident. Actually, the borderlines of these irradiation regions are blurred. The four sensors 121 described above are disposed to be included in these regions.

Next, the manner of controlling the exposure amount on the basis of the light quantity measurement through the sensors 820 and 821 disposed at the masking blade plane described hereinbefore and through the sensors 121 disposed at the opening of the aperture stop 15 of the masking imaging system, will be explained.

As the monitor sensor means for the exposure amount control, the sensors 820 and 821 at the masking blade plane are used. However, simultaneously, the light quantity may be measured by the sensors 121 at the aperture stop plane, in real time, and from dispersion of outputs of the sensors, a change in angular distribution characteristic of the arcuate illumination may be monitored and exposure amount control may be done as required.

Initially, for measurement of the light quantity at the light-blocked opposite end portions of the arcuate illumination region 812 through the sensors 820 and 821 to obtain expected exposure light amount, the illuminometer 26 on the wafer stage 20 is moved prior to the exposure into the projection system exposure region, and the illuminance on the wafer 19 surface, the light quantity measured by the sensors 820 and 821 (e.g., an average of the two sensor outputs), and the light quantity measured by the sensors 121 of the aperture stop (e.g., an average of the four sensor outputs) are measured simultaneously and the interrelationship of the three measured values is detected.

This operation is carried out with respect to each of the aperture stops prepared, to meet changeability of s or interchange of aperture stops 15 for deformed illumination, for example. Furthermore, if necessary, in place of the illuminometer 26 of the wafer stage, the illuminometer 25 of the reticle stage 17 may be used to perform the above-described operation.

The result of detection on the interrelationship of the sensors and the illuminometer, is supplied into the integrated exposure amount controller 27 (mechanism for controlling exposure amount), and it is stored as data. To this integrated exposure amount controller 27, outputs of the sensors at the masking blade 13 plane and outputs of the sensors at the aperture stop 15 plane of the masking imaging system are applied.

The integrated exposure amount controller 27 controls the duration of opening/closure of the shutter 28 on the basis of the light quantities detected by the above-described sensors. Thus, the EUV light emitted as pulses from the light source is blocked for predetermined time and, by this, the integrated exposure amount is controlled to be constant from the start to the end of the exposure.

In this embodiment, the quantity of light from the light source is monitored at plural positions. This enables better precision exposure amount control.

Furthermore, since the light quantity is monitored at a position which is conjugate with the mask or in Fourier transform relationship with the mask, illuminance distribution and effective light source distribution can be monitored simultaneously, as well.

Moreover, when the illumination optical system of this embodiment is used in an exposure apparatus, exposure amount control which has never been accomplished conventionally can be done. Thus, an illumination optical system quite suitably applicable to an exposure apparatus, by which the integrated exposure amount is kept constant and higher resolution images are produced stably, is accomplished.

Embodiment 2

Next, referring to FIGS. 13 and 14, an embodiment of a device manufacturing method which uses an exposure apparatus described above, will be explained.

Figure 13:
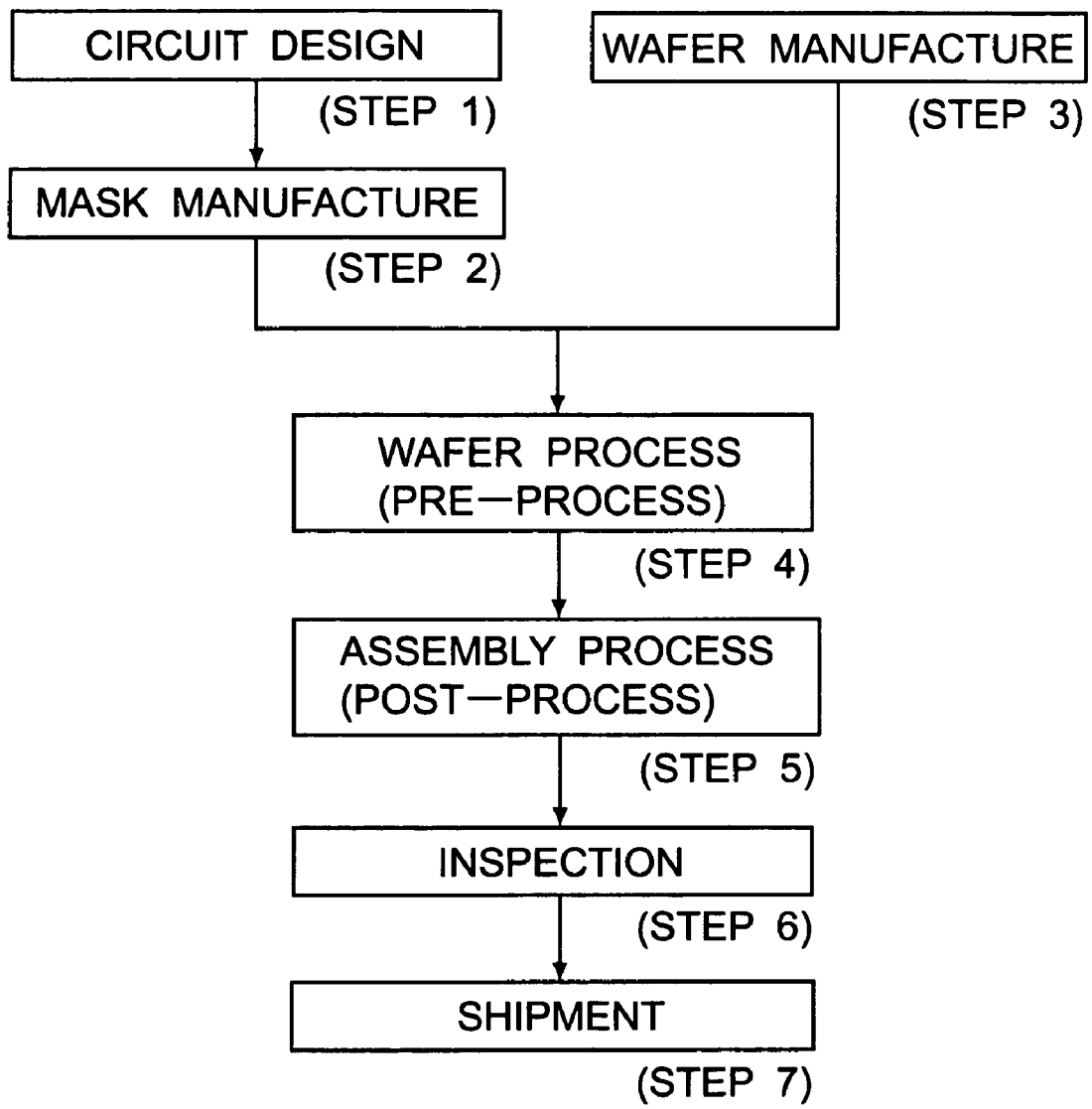
FIG. 13 is a flow chart for explaining sequence of device manufacturing processes.

FIG. 13 is a flow chart for explaining the procedure of manufacturing various microdevices such as semiconductor chips (e.g., ICs or LSIS), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 14:
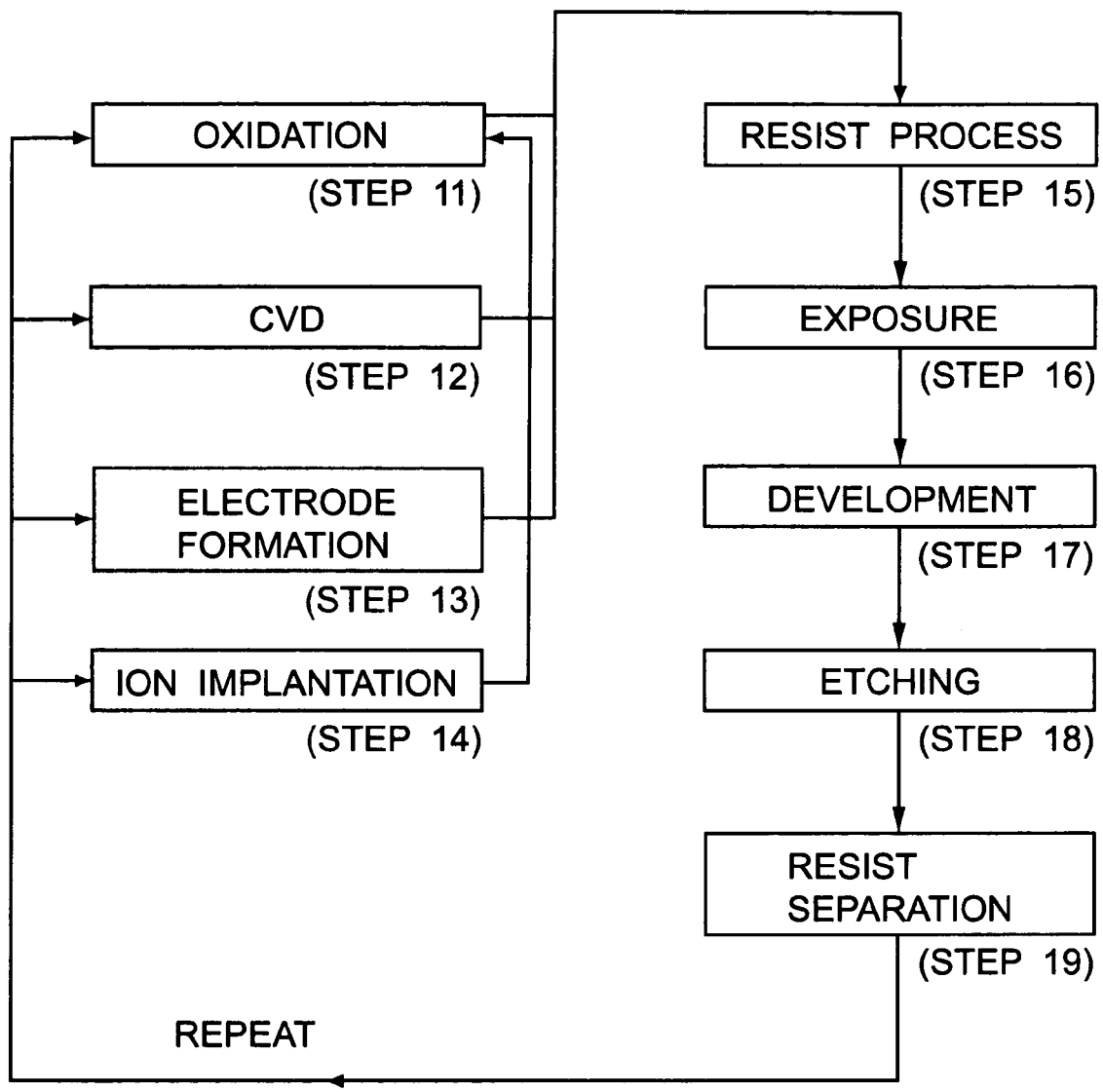
FIG. 14 is a flow chart for explaining details of a wafer process included in the procedure of FIG. 13.

FIG. 14 is a flow chart for explaining details of the wafer process. Step 11 is an oxidation process for oxidizing the surface of a wafer. Step 12 is a CVD process for forming an insulating film on the wafer surface. Step 13 is an electrode forming-process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices being difficult to be produced conventionally, can be manufactured.

While the invention has been described with reference to preferred embodiments thereof, the invention is not limited to them. Various changes and modifications are possible. For example, while the embodiments have been described in relation to an illumination system and an exposure apparatus using EUV light of a wavelength 13.5 nm, the present invention can be applied also to an illumination optical system and an exposure apparatus using different light such as, for example, light of extreme ultraviolet region of wavelength 200 nm to 10 nm, or light of X-ray region. Since a half mirror is difficult to use with light of 20 nm to 5 nm, the present invention can be particularly suitably applicable to an illumination optical system and an exposure apparatus using such region of light.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-342960 filed Oct. 1, 2003, for which is hereby incorporated by reference.

What is claimed is:

1. An illumination optical system for illuminating a surface to be illuminated, with light from a light source, said illumination optical system comprising:

a field stop disposed in a portion of a light path between the light source and the surface to be illuminated, said field stop being configured to regulate an illumination region upon the surface to be illuminated; and a sensor configured to monitor a quantity of light from the light source, wherein the light from the light source has a wavelength in a range of 20 nm to 5 nm, wherein said field stop includes a slit member having a slit-like opening and two light blocking plates configured to block light from the light source passing through opposite end portions of the slit-like opening of said slit member, and wherein said sensor is disposed on at least one of said two light blocking plates to monitor the quantity of light passing through at least one of the opposite end portions of the slit-like opening of said slit member.

2. An exposure apparatus, comprising:

an illumination optical system for illuminating a mask, having a surface to be illuminated, with light from a light source; and a projection optical system for projecting a pattern of the mask onto a substrate;

wherein the light from the light source has a wavelength in a range of 20 nm to 5 nm; and wherein said illumination optical system includes (i) a field stop disposed in a portion of a light path between the light source and the surface to be illuminated, said field stop being configured to regulate an illumination region upon the surface to be illuminated, and (ii) a sensor configured to monitor a quantity of light from the light source, wherein said field stop includes a slit member having a slit-like opening and two light blocking plates configured to block light from the light source passing through opposite end portions of the slit-like opening of said slit member, and wherein said sensor is disposed on at least one of said two light blocking plates to monitor the quantity of light passing through at least one of the opposite end portions of the slit-like opening of said slit member.

3. An exposure apparatus according to claim 2, further comprising an integrated-exposure-amount controller for controlling an integrated exposure amount of the substrate on the basis of the detection by said detector.

4. An exposure apparatus according to claim 2, wherein the substrate is exposed while being scanned by the light from the light source, and wherein said two light blocking plates are configured to regulate a width of the illumination region in a direction perpendicular to a scan direction.

5. An exposure apparatus according to claim 4, wherein said field stop further includes two light blocking plates which are movable in the scan direction and which are configured not to block the light to be monitored by said sensor even when they are moved in the scan direction.

6. An exposure apparatus according to claim 2, wherein the opening of said slit member has an arcuate shape.

* * * * *